United States Patent [19]
Jackson

[11] Patent Number: 5,329,282
[45] Date of Patent: Jul. 12, 1994

[54] MULTI-BIT SIGMA-DELTA ANALOG-TO-DIGITAL CONVERTER WITH REDUCED SENSITIVITY TO DAC NONLINEARITIES

[75] Inventor: H. Spence Jackson, Austin, Tex.

[73] Assignee: Motorola, Inc., Schaumburg, Ill.

[21] Appl. No.: 844,050

[22] Filed: Mar. 2, 1992

[51] Int. Cl.⁵ .............................................. H03M 3/04
[52] U.S. Cl. ...................................................... 341/143
[58] Field of Search ......................................... 341/143

[56] References Cited

U.S. PATENT DOCUMENTS

| | | | |
|---|---|---|---|
| 4,990,914 | 2/1991 | Giancarlo | 341/143 |
| 5,030,952 | 7/1991 | Ledzius et al. | 341/143 |
| 5,057,840 | 10/1991 | Ledzius et al. | 341/144 |
| 5,084,702 | 1/1992 | Ribner | 341/143 |
| 5,134,402 | 7/1992 | Miyoshi | 341/143 X |
| 5,162,799 | 10/1992 | Tanimoto | 341/143 |

OTHER PUBLICATIONS

"The Design of Sigma-Delta Modulation Analog-to-Digital Converters." by Boster et al. in IEEE Journal of Solid State Circuits, vol. 23, No. 6, Dec. 1988, pp. 1298-1308.
"An Improved Sigma-Delta Modulator Architecture." by Leslie, T. and Singh, B. in IEEE ISCAS, 1990, pp. 372-375.
Cataltepe, et al. "Digitally Corrected Multi-Bit εΔData Converters," IEEE Proc. ISCAS 1989 pp. 647-650, May 1989.

Primary Examiner—Howard L. Williams
Attorney, Agent, or Firm—Maurice Jones; Paul J. Polansky

[57] ABSTRACT

A multi-bit sigma-delta analog-to-digital converter (ADC) (40) includes a sigma-delta modulator (41) with a multi-bit quantizer (46) and a digital-to-analog converter (DAC) (47). An output of the DAC (47) provides an error signal of the modulator (41). The quantizer (46) provides a quantized signal having multiple bits ordered from a most-significant bit, to a second most significant bit, to at least one lower-order bit including a least-significant bit. At least two of these bits, including the most significant bit and one of the lower-order bit or bits, are provided as inputs to the DAC (47). The remaining bits are provided as inputs to a prefilter (49), which performs the same transfer function as a comparable multibit modulator. A summing device (49) subtracts the output of the prefilter (48) from the quantized signal. A decimation filter (50) resamples the output of the summing device (49) to provide the output of the ADC (40).

12 Claims, 3 Drawing Sheets

MULTI-BIT SIGMA-DELTA ANALOG-TO-DIGITAL CONVERTER WITH REDUCED SENSITIVITY TO DAC NONLINEARITIES

FIELD OF THE INVENTION

This invention relates generally to analog-to-digital converters, and more particularly, to sigma-delta type analog-to-digital converters.

BACKGROUND OF THE INVENTION

There are two basic techniques for performing analog-to-digital conversion. An analog-to-digital converter (ADC) using the first technique, known as the open-loop technique, generates a digital signal directly in response to an analog input signal. The open-loop ADC samples the analog input signal at twice the frequency (known as the Nyquist frequency) of the highest expected frequency component of the input signal. The open-loop ADC uses a series of precisely-matched components to digitize the input signal. The resolution and accuracy of the open-loop ADC depend on the matching of these components. However, highly-precise components are difficult to achieve in conventional integrated circuit processing.

An ADC using the second technique, known as the sigma-delta technique, represents the analog input signal by generating a stream of digital samples whise density gives the correct average voltage. The sigma-delta ADC includes a sigma-delta modulator and a decimation filter. The modulator includes a quantizer which generates a digital output signal in response to a filtered difference between the analog input signal and a feedback signal. The feedback signal is the digital output signal reconverted to an analog signal in a digital-to-analog converter (DAC). The modulator is oversampled, meaning that the sampling rate is well above the Nyquist rate. The decimation filter resamples the output of the modulator and provides an N-bit data word at the Nyquist rate. The sigma-delta technique achieves high resolution by precise timing instead of by precisely-matched components (resistors and capacitors) which are required by the open-loop ADC.

A simple sigma-delta ADC uses a first-order modulator with a single integrator performing the filter function, a one-bit quantizer, and a one-bit DAC. Since the quantizer can provide the output of the modulator at only one of two levels, its operation is necessarily linear. The first-order sigma-delta modulator has high quantization noise at the sampling frequency. The action of the filter in the modulator shapes the quantization noise to be higher at higher frequencies. Thus, the converter is referred to as a noise-shaping ADC. The decimation filter has a lowpass characteristic with a cutoff frequency at the Nyquist frequency. Since the sampling frequency is much higher than the Nyquist frequency, the filters can usually attenuate this out-of-band quantization noise sufficiently.

A second-order ADC having two filters in the modulator loop has higher out-of-band quantization noise but lower in-band noise than the first-order ADC. Thus, if the out-of-band noise can be sufficiently filtered, the second-order sigma-delta modulator has better performance. The necessary attenuation can be achieved if the decimation filter is one order greater than the order of the modulator. ADCs higher than second order are possible but typically have stability problems.

One way to increase the resolution of a sigma-delta ADC is to substitute a multi-bit quantizer for the single-bit quantizer. In this case the DAC in the feedback loop must also be multi-bit and the linearity of the multi-bit DAC must be as high as that of the overall ADC. To achieve high DAC linearity, costly error correction techniques are necessary. These error correction techniques would cause the sigma-delta ADC to lose its independence of processing variations. Thus, new techniques are needed to improve the resolution of sigma-delta ADCs.

SUMMARY OF THE INVENTION

Accordingly, there is provided, in one form, a multi-bit sigma-delta analog-to-digital converter with improved performance comprising a sigma-delta modulator, a prefilter, a summing device, and a decimation filter. The sigma-delta modulator includes a quantizer and a digital-to-analog converter. The sigma-delta modulator receives an analog input signal, and provides a digitized signal having a plurality of bits ordered from a most significant bit, to a second most significant bit, to at least one lower-order bit including a least significant bit. The digital-to-analog converter receives a plurality of feedback bits including the most significant bit and one of the at least one lower-order bit or a second most significant bit and provides a bits of the digitized signal except for the plurality of feedback signal of the sigma-delta modulator in response thereto. The prefilter is coupled to the sigma-delta modulator, receives the plurality of feedback bits, and performs a predetermined transfer function thereon to provide a pre-filtered signal. The second summing device is coupled to the quantizer and to the prefilter, and has a positive input terminal for receiving the digitized signal, a negative input terminal for receiving the pre-filtered signal, and an output. The decimation filter is coupled to the second summing device, and has an input coupled to the output of the second summing device, and an output providing a digital output of the analog-to-digital converter.

These and other features and advantages will be more clearly understood from the following detailed description taken in conjunction with the accompanying drawings.

DETAILED DESCRIPTION OF THE INVENTION

Figure 1:
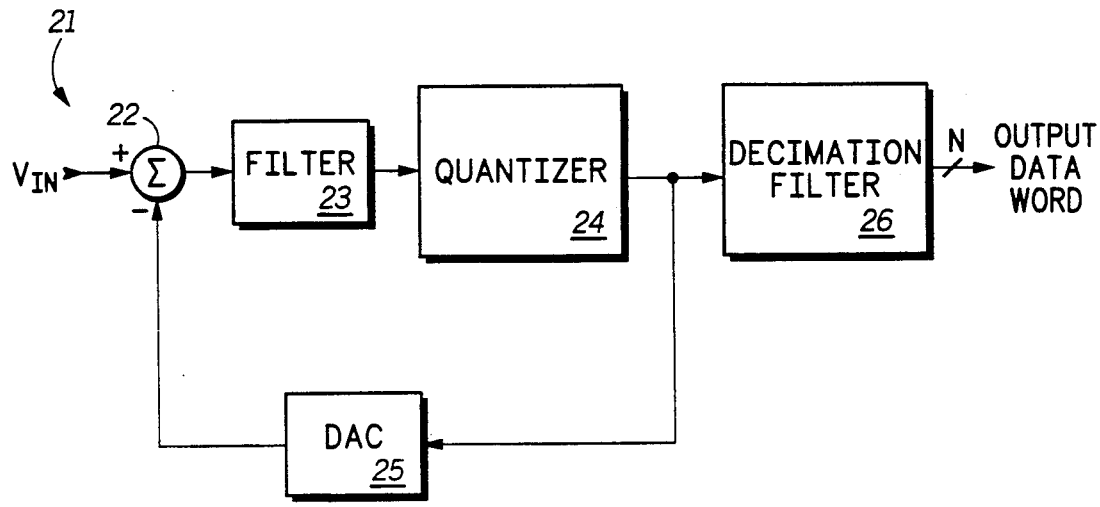
FIG. 1 illustrates in block diagram form a first order sigma-delta analog-to-digital converter (ADC) known in the prior art.

FIG. 1 illustrates in block diagram form a first order sigma-delta analog-to-digital converter (ADC) 20 known in the prior art. ADC 20 includes generally a sigma-delta modulator 21 and a decimation filter 26. Sigma-delta modulator 21 includes a summing device 22, a filter 23, a quantizer 24, and a digital-to-analog converter (DAC) 25. Summing device 22 receives an analog input signal labelled "$V_{IN}$" and subtracts a feedback signal received from DAC 25 therefrom. The output of summing device 22 is provided to filter 23. Filter 23 is an analog integrator-type filter which provides an analog output to quantizer 24. Quantizer 24 is an one-bit quantizer, and provides a one-bit digitized output signal to DAC 25 and decimation filter 26. DAC 25 is a one-bit DAC and provides the feedback signal in response to the digitized output signal. Decimation filter 26 provides an N-bit "OUTPUT DATA WORD" in response to the output of quantizer 24 at the Nyquist rate.

Overall, sigma-delta modulator 21 provides a series of pulses whose density gives the correct average voltage of the analog input signal. Decimation filter 26 samples the output of quantizer 24 at the sampling rate and provides the N-bit OUTPUT DATA WORD at the Nyquist rate therefrom. There are three known techniques that could be used to improve the resolution of ADC 21. First, the oversampling rate could be increased. For example, if the Nyquist frequency is 40 kilohertz (kHz), then an oversampling rate of 256 would require approximately a 10 megahertz (MHz) sampling rate. However, the oversampling rate is limited by the speed of conventional integrated circuit technology and a 10 MHz sampling rate is near the limits of conventional CMOS technology.

Second, ADC 20 of could be improved by increasing the order of sigma-delta modulator 21. Second-order sigma-delta modulators are in fact known in the art and are practicable. See, for example, "The Design of Sigma-Delta Modulation Analog-to-Digital Converters," by Boser and Wooley in *IEEE Journal of Solid State Circuits*, vol. 23, no. 6, December 1988, pp. 1298–1308. Second-order sigma-delta modulators improve performance for oversampling ratios greater than about 10. However, using a third- or higher-order sigma-delta modulator causes instability problems which are difficult to compensate. Furthermore, decimation filter 26 must be already be one order higher than the overall order of sigma-delta modulator 21. Increasing the order of decimation filter 26 beyond third order significantly increases integrated circuit area and is very expensive.

Third, a multi-bit quantizer could be substituted for one-bit quantizer 24 and a multi-bit DAC could be substituted for DAC 25. If a second-order sigma-delta modulator is used, each added bit of quantizer 24 and DAC 25 results in a 6 dB improvement in signal-to-noise ratio (SNR). In this case, the linearity of DAC 25 would have to match the linearity of ADC 20. The complexity of the circuitry required for DAC 25 would defeat the advantage of the sigma-delta technique as being independent of processing variations.

Figure 2:
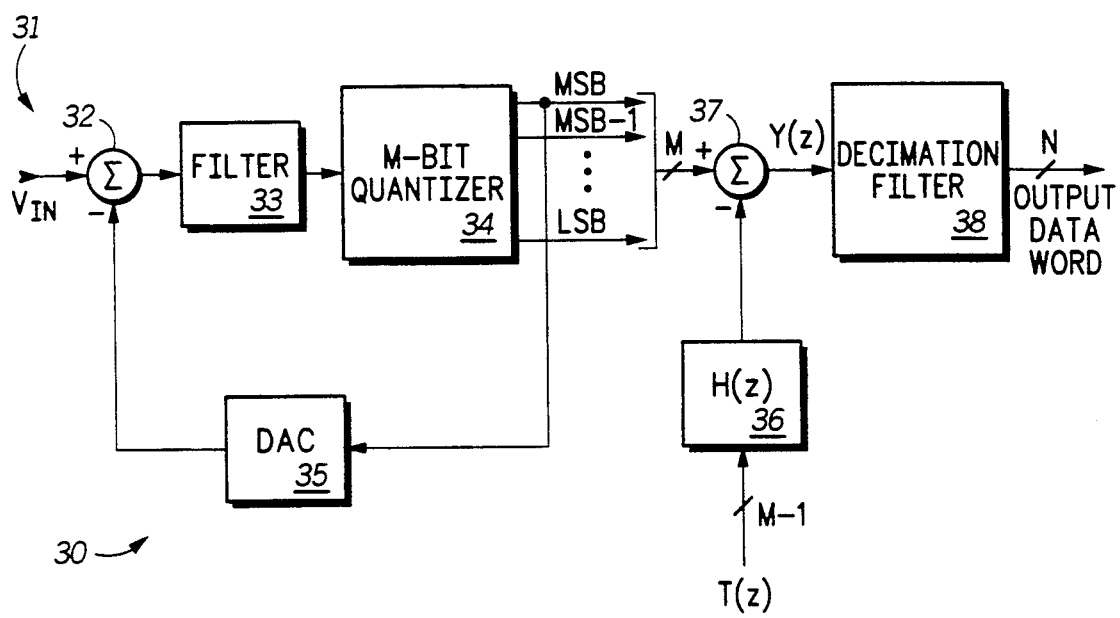
FIG. 2 illustrates a prior art sigma-delta ADC 30 having a multi-bit quantizer.

However, one technique to solve the problem of using a multi-bit quantizer in ADC 20 was disclosed by Leslie and Singh in "An Improved Sigma-Delta Modulator Architecture," in the 1990 *IEEE ISCAS*, pp 372-375 and is illustrated in FIG. 2. FIG. 2 illustrates a prior art sigma-delta ADC 30 having a multi-bit quantizer, which eliminates the need for a high linearity DAC. ADC 30 includes generally a sigma-delta modulator 31, and a decimation filter 38. Sigma-delta modulator 31 includes a summing device 32, a filter 33, an M-bit quantizer 34, a DAC 35, a prefilter function 36, and a summing device 37. As in ADC 20 of FIG. 1, summing device 32 subtracts a feedback signal provided by DAC 35 from analog input voltage $V_{IN}$. The output of summing device 32 is provided to filter 33. Filter 33 is an analog integrator-type filter which provides an analog output to M-bit quantizer 34. The M output bits are ordered from a most-significant bit to a least significant bit and are designated "MSB", "MSB−1", etc. to "LSB", respectively. DAC 35 receives only the MSB, and provides the feedback signal in response thereto. Prefilter function 36 receives the truncated signal labelled "T(z)" from M-bit quantizer 34, which includes the (M−1) output bits of M-bit quantizer 34 except for the MSB. Prefilter function 36 performs a transfer function labelled "H(z)" which makes ADC 30 have the same transfer function as the overall transfer function of a corresponding M-bit ADC. Summing device 37 subtracts the output of prefilter function 36 from the MSB to provide an output labelled "Y(z)". Decimation filter 37 receives Y(z) from summing device 37 and provides the N-bit DATA OUTPUT WORD in response.

Because ADC 30 feeds back only the MSB of quantizer 33, DAC 35 need only be a one-bit DAC, which is always linear. The extra bits of M-bit quantizer 34 significantly improve the resolution of ADC 30. For example, a Leslie and Singh ADC with a six-bit quantizer improves the SNR without the need for a highly linear DAC. While ADC 30 provides a significant improvement in sigma-delta ADCs with multi-bit quantizers, further improvement is desirable. Such further improvement is provided by an ADC according to the present invention.

Figure 3:
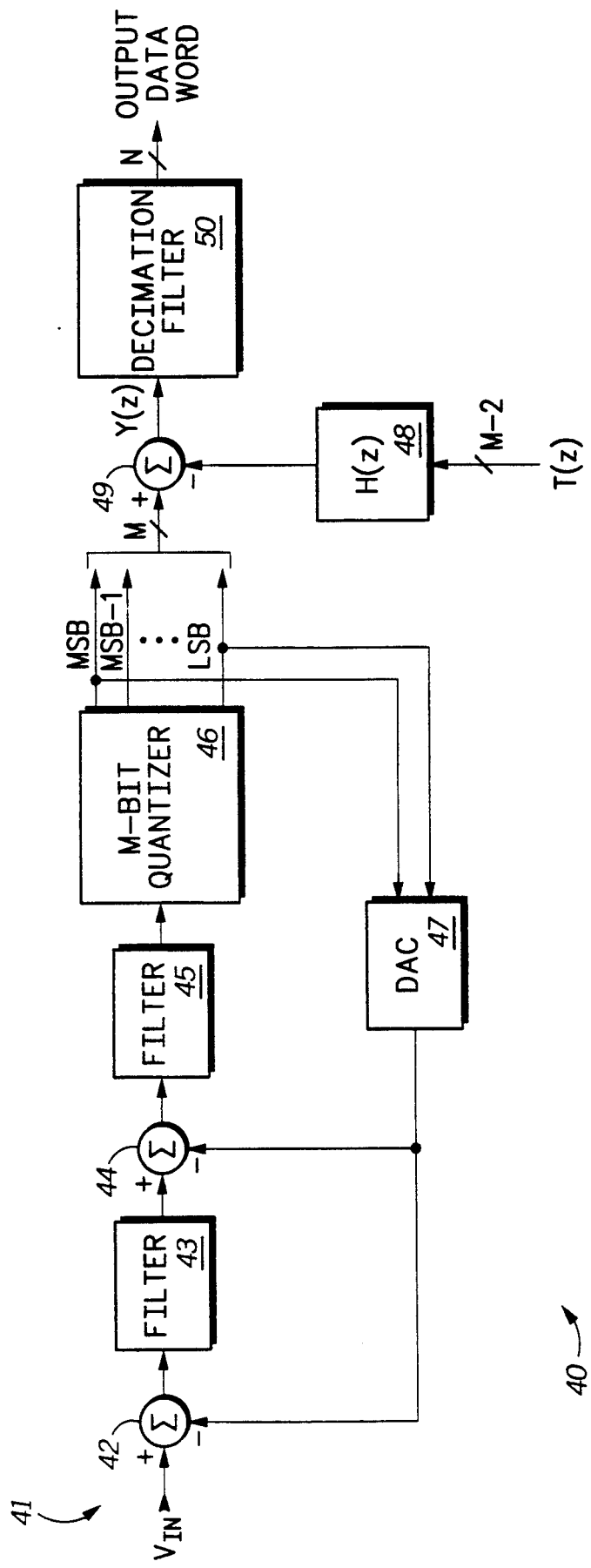
FIG. 3 illustrates in block diagram form a second order sigma-delta ADC in accordance with the present invention.

FIG. 3 illustrates in block diagram form a second order sigma-delta ADC 40 in accordance with the present invention. ADC 40 includes generally a sigma-delta modulator 41, and a decimation filter 50. Sigma-delta modulator 41 includes a summing device 42, a filter 43, a summing device 44, a filter 45, an M-bit quantizer 46, a DAC 47, a prefilter function 48, and a summing device 49. Summing device 42 receives analog input voltage $V_{IN}$, and subtracts a feedback signal received from DAC 47 therefrom. The output of summing device 42 is provided to filter 43. Filter 43 is an analog integrator-type filter which provides an analog output to summing device 44. Summing device 44 subtracts the output of DAC 47 from the output of filter 43. The output of summing device 44 is provided to filter 45. Filter 45 is an analog integrator-type filter which provides an analog output to M-bit quantizer 46. M-bit quantizer 46 is implemented as a flash converter. The M output bits are ordered from a most-significant bit to a least significant bit and are designated "MSB", "MSB−1", etc. to "LSB", respectively. DAC 47 receives two output bits from M-bit quantizer 46 and provides the feedback signal in response; in the illustrated embodiment, DAC 47 receives MSB and LSB. Summing device 49 receives the M output bits of quantizer 46. Prefilter function 48 receives (M−2) bits, which are all the output bits of quantizer 46 except the two selected bits (MSB−1 to LSB+1 in the illustrated embodiment). Prefilter function 48 performs a transfer function labelled "H(z)" which makes ADC 40 have the same transfer function as the overall transfer function of a corresponding M-bit ADC. Summing device 49 subtracts the output of prefilter function 48 from the two selected output bits of quantizer 46 to provide an output labelled "Y(z)". Decimation filter 50 then receives Y(z) from summing device 49 and provides the N-bit OUTPUT DATA WORD at the Nyquist rate in response.

Modulator 41 is a pseudo multi-bit sigma-delta modulator because not all of the multiple output bits of quantizer 46 are used to generate the feedback signal. The second bit fed back to DAC 47 is not the second most significant bit. The linearity requirement of DAC 47 is reduced by 6 dB for each bit between the MSB and the second bit fed back to DAC 47. Furthermore, the weighting of DAC 47 represents the weighting of the bits fed back from quantizer 46. ADC 40 improves the SNR above that of ADC 30 of FIG. 2 by including the LSB in the feedback path. Because the LSB is included, quicker resolution of $V_{IN}$ is achieved when the signal level is relatively small, while maintaining the improvement of ADC 30 for larger signal levels. When the signal level falls below that which may be represented by the LSB, then the SNR improves over ADC 30. One result of the improved performance is that ADC 40 has much better rejection of tones which are a result of insufficient resolution of the input signal. In ADC 40, the MSB and the LSB were used. However, another bit besides the LSB may be used as the second bit. Also, more than two bits may be used. The only requirement is that the second bit (and other bits, if used) not be the MSB or the (MSB−1) bit in order to reduce the linearity requirements of DAC 47.

Figure 4:
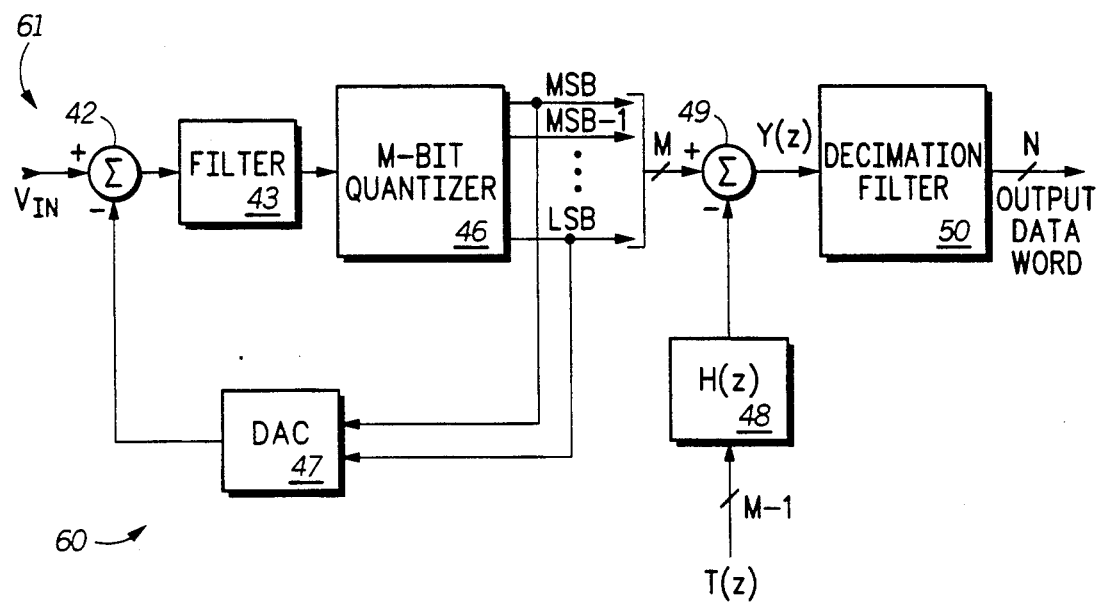
FIG. 4 illustrates in block diagram form a first order sigma delta ADC in accordance with the present invention.

ADC 40 uses second-order sigma-delta modulator 41. In another embodiment, a single-order modulator may be used as in FIG. 4, which illustrates in block diagram form a first order signma delta ADC 60 in accordance with the present invention. ADC 60 includes a first-order modulator 61 which provides the output of filter 43 to quantizer 46, and eliminates summing device 44 and filter 45. While providing a lower SNR, first-order modulator 61 requires less circuit area and may be acceptable for some applications. As noted earlier, modulator 41 could also be third- or higher-order. However, because of the stability problems associated with modulators higher than second order, modulator 41 is preferred.

While the invention has been described in the context of a preferred embodiment, it will be apparent to those skilled in the art that the present invention may be modified in numerous ways and may assume many embodiments other than that specifically set out and described above. As previously mentioned, a first-order modulator may be used at some sacrifice of performance. In other embodiments, more than two bits may be fed back to DAC 47. The only limitation is that the bits which are not the MSB are separated from the MSB by at least one bit. Accordingly, it is intended by the appended claims to cover all modifications of the invention which fall within the true spirit and scope of the invention.

I claim:

1. A multi-bit sigma-delta analog-to-digital converter with improved performance comprising:
   a sigma-delta modulator including a quantizer and a digital-to-analog converter, for receiving an analog input signal and for providing a digitized signal having a plurality of bits ordered from a most significant bit, to a second most significant bit, to at least one lower-order bit including a least significant bit, said digital-to-analog converter receiving a plurality of feedback bits including said most significant bit and one of said at least one lower-order bit and providing a feedback signal of the sigma-delta modulator in response thereto;
   a prefilter coupled to said sigma-delta modulator, for receiving said plurality of bits of said digitized signal except for said plurality of feedback bits, and performing a predetermined transfer function thereon to provide a pre-filtered signal;
   a summing device coupled to said quantizer and to said prefilter, having a positive input terminal for receiving said digitized signal, a negative input terminal for receiving said pre-filtered signal, and an output; and
   a decimation filter coupled to said summing device, having an input coupled to said output of said second summing device, and an output for providing a digital output of the analog-to-digital converter.

2. The analog-to-digital converter of claim 1 wherein said sigma-delta modulator is characterized as being a first-order sigma-delta modulator.

3. The analog-to-digital converter of claim 1 wherein said sigma-delta modulator is characterized as being a second-order sigma-delta modulator.

4. The analog-to-digital converter of claim 1 wherein said predetermined transfer function of said prefilter provides an overall transfer function of said analog-to-digital converter substantially identical to transfer function of a corresponding analog-to-digital converter which provides all of said plurality of bits to said digital-to-analog converter.

5. The analog-to-digital converter of claim 1 wherein an order of said decimation filter exceeds an order of said sigma-delta modulator by one.

6. The analog-to-digital converter of claim 1 wherein said second bit is said least significant bit.

7. A multi-bit sigma-delta analog-to-digital converter with improved performance comprising:
   a first summing device having a positive input terminal for receiving an analog input signal, a negative input for receiving a feedback signal, and an output for providing an error signal;
   a filter having an input for receiving said output of said first summing device, and an output for providing a filtered signal;
   a quantizer coupled to said filter, having an input for receiving said filtered signal, and an output providing a digitized signal having a plurality of bits ordered from a most significant bit, to a second most significant bit, to at least one lower-order bit including a least significant bit;
   a digital-to-analog converter coupled to said quantizer, having inputs for receiving respective ones of a plurality of feedback bits of said digitized signal including said most significant bit and one of said at least one lower-order bit, and an output for providing said feedback signal;
   a prefilter coupled to said quantizer, for receiving said plurality of bits of said digitized signal except for said plurality of feedback bits, and performing a predetermined transfer function thereon to provide a pre-filtered signal;
   a second summing device coupled to said quantizer and to said prefilter, having a positive input terminal for receiving said digitized signal, a negative input terminal for receiving said pre-filtered signal, and an output; and
   a decimation filter coupled to said second summing device, having an input coupled to said output of said second summing device, and an output for providing a digital output of the analog-to-digital converter.

8. The analog-to-digital converter of claim 7 wherein said second bit is said least significant bit.

9. A multi-bit sigma-delta analog-to-digital converter with improved performance comprising:
- a first summing device having a positive input terminal for receiving an analog input signal, a negative input for receiving a feedback signal, and an output for providing a first error signal;
- a first filter having an input for receiving said output of said first summing device, and an output for providing a first filtered signal;
- a second summing device having a positive input terminal for receiving said first filtered signal, a negative input for receiving said feedback signal, and an output for providing a second error signal;
- a second filter having an input for receiving said output of said second summing device, and an output for providing a second filtered signal;
- a quantizer coupled to said second filter, having an input for receiving said second filtered signal, and an output providing a digitized signal having a plurality of bits ordered from a most significant bit, to a second most significant bit, to at least one lower-order bit including a least significant bit;
- a digital-to-analog converter coupled to said quantizer, having inputs for receiving respective ones of a plurality of feedback bits of said digitized signal including said most significant bit and one of said at least one lower-order bit, and an output for providing said feedback signal;
- a prefilter coupled to said quantizer, for receiving said plurality of bits of said digitized signal except for said plurality of feedback bits, and performing a predetermined transfer function thereon to provide a pre-filtered signal;
- a third summing device coupled to said quantizer and to said prefilter, having a positive input terminal for receiving said digitized signal, a negative input terminal for receiving said pre-filtered signal, and an output; and
- a decimation filter coupled to said third summing device, having an input for coupled to said output of said third summing device, and an output for providing a digital output of the analog-to-digital converter.

10. The analog-to-digital converter of claim 9 wherein said second bit is said least significant bit.

11. A multi-bit sigma-delta analog-to-digital converter with improved performance comprising:
- means for subtracting a feedback signal from an analog input signal to provide an error signal;
- means for filtering said error signal to provide a filtered signal;
- means for quantizing said filtered signal into a first digitized signal having a plurality of bits ordered from a most significant bit, to a second most significant bit, to at least one lower-order bit including a least significant bit;
- means for converting a plurality of feedback bits of said first digitized signal including said most significant bit and one of said at least one lower-order bit into said feedback signal;
- means coupled to said quantizer, for filtering said plurality of bits of said digitized signal except for said plurality of feedback bits to provide a pre-filtered signal;
- means for subtracting said pre-filtered signal from said first digitized signal to provide a second digitized signal; and
- means for resampling said second digitized signal to provide a digital output of the analog-to-digital converter.

12. The analog-to-digital converter of claim 11 wherein said converting means comprises a digital-to-analog converter.

* * * * *